United States Patent [19]

Miyata et al.

[11] 4,209,771

[45] Jun. 24, 1980

[54] CODE CONVERTING METHOD AND SYSTEM

[75] Inventors: Masachika Miyata, Tokyo; Eiichi Amada, Kokubunji, both of Japan

[73] Assignee: Hitachi, Ltd., Japan

[21] Appl. No.: 943,618

[22] Filed: Sep. 19, 1978

[30] Foreign Application Priority Data

Sep. 30, 1977 [JP] Japan ................................. 52-116837

[51] Int. Cl.$^2$ ............................................. H04L 3/00
[52] U.S. Cl. ............................................. 340/347 DD
[58] Field of Search .............. 340/347 DD; 325/38 A

[56] References Cited

U.S. PATENT DOCUMENTS

| | | | |
|---|---|---|---|
| 2,700,696 | 1/1955 | Barker | 325/38 A |
| 3,133,280 | 5/1964 | Crater | 325/38 A |
| 3,214,749 | 10/1965 | Karnaugh | 325/38 A |
| 3,226,685 | 12/1965 | Potter | 325/38 A |
| 3,623,078 | 11/1971 | Whiting | 325/38 A |
| 4,020,282 | 4/1977 | Halpern | 325/38 A |

OTHER PUBLICATIONS

Weller "IEEE Trans., Com. Tech.", vol. Com-19, Dec. 1971, pp. 1064–1069.

*Primary Examiner*—Charles D. Miller
*Attorney, Agent, or Firm*—Craig & Antonelli

[57] ABSTRACT

A code converting method in which a multivalue signal $x_i$ sampled at a sampling period of mT, where m (an even number) equals $2^n$ (n being integer) and $x_i$ is nonnegative integer not greater than m, is received and subjected to density conversion to be delivered out in the form of a train of m binary signals sampled at a sampling period of T. A Z-transform Y(Z) of the binary signal to be delivered out is expressed as, $$Y(Z) = \sum_{i=0}^{\infty} \hat{H}(x_i, q_i, Z) \cdot Z^{-mi},$$

where $q_{i+1} \equiv q_i + X_{i+1} + m$, and mod 2; $q_o = 0$ and where $\hat{H}(x_i, q_i, Z)$ represents a polynomial of the order related to $Z^{-1}$ not greater than (m−1) which has non-zero terms having each a coefficient of 1(one) and which satisfies $\hat{H}(k, q_i, 1) = k$, $\hat{H}(k, q_i, Z) = Z^{-(m-1)} \hat{H}(k, q_i, 1/Z)$ and $\hat{H}(k, 0, Z) = \hat{H}(k, 1, Z)$ for k being an even number, and $\hat{H}(k, 0, Z) = Z^{-(m-1)} \hat{H}(k, 1, 1/Z)$ for k being an odd number.

7 Claims, 3 Drawing Figures

: + COMPONENT

: − COMPONENT (a) k=1, q=0   (b) k=2, q=0   (c) k=3, q=0
(d) k=1, q=1   (e) k=2, q=1   (f) k=3, q=1

CODE CONVERTING METHOD AND SYSTEM

This invention relates to a method and system for converting a multivalue signal sampled at a long sampling period into a binary signal sampled at a short sampling period.

A binary rate multiplier (hereinafter referred to as BRM), for example, as disclosed in C. W. Weller: IEEE Trans., Com. Tech., Vol. COM-19, pages 1064 to 1069 (Dec. 1971) has been well known as a circuit for converting the level of a multivalue signal sampled at a sampling period of mT into the density of one level of binary signals sampled at a sampling period of T, as in the case where a signal subjected to the differential pulse code modulation is converted into a signal subjected to the delta modulation.

In BRM, the sampled values are so restricted as to correspond to non-negative integer less than m and each sampled value undergoes the block conversion independently. More particularly, let a Z-transform of the input signal be $$X(Z^m) = \sum_{i=0}^{\infty} X_i Z^{-mi} \quad (1),$$

then a Z-transform of the output signal may be expressed as, $$Y(Z) = \sum_{i=0}^{\infty} H(x_i, Z) Z^{-mi} \quad (2)$$

where $x_i$ represents non-negative integer not greater than m and $H(X_i, Z)$ a polynomial of the order related to $Z^{-1}$ not greater than $(m-1)$. The fact that the order of $H(x_i, Z)$ is not greater $(m-1)$ means that each input sampled value undergoes block conversion independently.

Take $m=8$, for example, $H(x_i, Z)$ is representative of:

$H(0,Z)=0$ $H(1,Z)=Z^{-4}$ $H(2,Z)=Z^{-2}(1+Z^{-4})$ $H(3,Z)=Z^{-2}(1+Z^{-2}+Z^{-4})$ $H(4,Z)=Z^{-1}(1+Z^{-2}+Z^{-4}+Z^{-6})$ $H(5,Z)=Z^{-1}(1+Z^{-2}+Z^{-3}+Z^{-4}+Z^{-6})$ $H(6,Z)=Z^{-1}(1+Z^{-1}+Z^{-2}+Z^{-4}+Z^{-5}+Z^{-6})$ $H(7,Z)=Z^{-1}(1+Z^{-1}+Z^{-2}+Z^{-3}+Z^{-4}+Z^{-5}+Z^{-6})$ $H(8,Z)=1+Z^{-1}+Z^{-2}+Z^{-3}+Z^{-4}+Z^{-5}+Z^{-6}+Z^{-7}$.

In general, the number of terms of a polynomial $H(k, Z)$ is designated by k, and it is meant by this that the number of logical value "1" pulses to be delivered out is k when the input sampled value is k. In this sense, the level of input sampled value can fairly accurately be converted into the density of output pulses. However, when the input $X(Z^m)$ is so interpolated through a low pass filter having a transfer function of $$\tilde{H}(Z) = \frac{1}{m} \sum_{i=0}^{\infty} Z^{-i} \quad (3)$$

as to be $$\tilde{X}(Z) = \sum_{i=0}^{\infty} x_i \tilde{H}(Z) Z^{-mi} \quad (4)$$

and the difference between the output $Y(Z)$ and the interpolated signal $\tilde{X}(Z)$, i.e., $$N(Z) = Y(Z) - \tilde{X}(Z) \quad (5)$$

is considered a quantization noise due to quantizing the output sampled value into the binary code, it is impossible to obtain a high signal to inband quantization noise power ratio, as will be described below. The signal bandwidth is herein considered half the input sampling frequency and corresponds to $(\frac{1}{2})mT$.

Since $\tilde{H}(Z)$ is a polynomial of the order not greater than $(m-1)$ with respect to $Z^{-1}$, even when $X(Z^m)$ is interpolated by $\tilde{H}(Z)$, each sampled value may be treated independently. Therefore, when the nature of quantization noise related to each sampled value is examined, the nature of the power spectrum of the quantization noise $N(Z)$ may be clarified.

It is usual to evaluate a signal $Y(Z)$ subject to the density modulation by the aid of signal to inband quantization noise power ratio of a waveform resulting from integrating the signal $Y(Z)$ and therefore, the nature of a Z-transform of integrating waveform of the quantization noise due to quantizing the sampled value $x_i$ is important, the Z-transform being expressed as, $$G(x_i, Z) = \frac{H(x_i, Z) - x_i \tilde{H}(Z)}{1 - Z^{-1}} \quad (6).$$

As aforementioned, the number of non-zero terms of $H(k,Z)$ is k and the coefficient thereof is 1(one) so that $H(k,1) = k$ and from equation (3)

$k\tilde{H}(1) = k$ is obtained and $G(x_i, 1)$ proves to have a definite value. However, $G(k,1) = 0$ stands only when $k=0$ and $k=m$. Accordingly, it cannot be expected, except for a particular case, that the power spectrum of quantization noise compnent of the waveform resulting from integrating the signal $Y(Z)$ becomes nearly zero around the direct current.

The present invention contemplates a code converting method for converting a multivalue signal of a sampling period mT into a binary signal of a sampling period T and has for its object to provide a converting method capable of obtaining a high signal to inband quantization noise power ratio of the signal subject to the code conversion.

Another object of the invention is to provide a simple code converting circuit which is effectively adaptive to the code converting method capable of obtaining the high signal to inband quantization noise power ratio.

According to one aspect of the invention, there is provided a code converting method in which a multivalue signal $x_i$ ($x_i$ being non-negative integer not greater than m; m being even number) of a sampling period mT is received and subjected to the density conversion to be delivered out in the form of a train of m binary signals of a sampling period T, wherein a Z-transform Y(Z) of the binary signals to be delivered out is expressed as, $$Y(Z) = \sum_{i=o}^{\infty} \hat{H}(x_i, q_i, Z) Z^{-mi}$$

where $q_i$ is zero or 1(one) and where $\hat{H}(x_i, q_i, Z)$ represents a polynomial of the order related to $Z^{-1}$ not greater than (m−1) which has non-zero terms having each a coefficient of 1(one) and which satisfies $\hat{H}(k, q_i, 1) = k$, $\hat{H}(k, q_i, Z) = Z^{-(m-1)} \hat{H}(k, q_i, 1/Z)$ for k being an even number, and $\hat{H}(k, 0, Z) = Z^{-(m-1)} \hat{H}(k, 1, 1/Z)$ for k being an odd number.

Preferably, $\hat{H}(x_i, q_i, Z)$ satisfies $\hat{H}(k, 0, Z) = \hat{H}(k, 1, Z)$ for k being an even number.

According to another aspect of the invention, there is provided a code converting system in which a multivalue signal $x_i$ ($x_i$ being non-negative integer not greater than m being even number) of a sampling period mT is received and subjected to the density conversion to be delivered out in the form of a train of m binary signals of a sampling period T, the system comprising a holding circuit for holding the multivalue signal $x_i$ at the period mT, means for inverting its output state when the multivalue signal assumes an odd number, and operation means receiving the output of the holding circuit and the output of the inverting means and delivering out a Z-transform Y(Z) of the binary signals to be delivered out, the Z-transform being expressed as, $$Y(Z) = \sum_{i=o}^{\infty} \hat{H}(x_i, q_i, Z) Z^{-mi}$$

where $\hat{H}(x_i, q_i, Z)$ represents a polynomial of the order related to $Z^{-1}$ not greater than (m−1) which has non-zero terms having each a coefficient of 1(one) and which satisfies $\hat{H}(k, q_i, 1) = k$, $\hat{H}(k, q_i, Z) = Z^{-(m-1)} \hat{H}(k, q_i, 1/Z)$ for k being an even number, and $\hat{H}(k, 0, Z) = Z^{-(m-1)} \hat{H}(k, 1, 1/Z)$ for k being an odd number.

The principle of the invention will be described hereunder.

The input signal $X(Z^m)$ as expressed by equation (1) is converted into the binary signal whose Z-transform is written by $$\hat{Y}(Z) = \sum_{i=o}^{\infty} \hat{H}(x_i, q_i, Z) Z^{-mi} \quad (7)$$

where $q_i$ is a binary signal equaling 0(zero) or 1(one) and satisfies, for example, the following equations, $$q_o = 0 \quad (8)$$

$$q_{i+1} = q_i + x_{1+1} + m, \text{ mod } 2 \quad (9)$$

and where $\hat{H}(x_i, q_i, Z)$ represents a polynomial of the order not greater than (m−1) with respect to $Z^{-1}$ which has non-zero terms having each a coefficient of 1(one) and satisfies the following conditions for m being an even number. Corresponding to equation (6), let $$\hat{G}(x_i, q_i, Z) = \frac{\hat{H}(x_i, q_i, Z) - x_i \tilde{H}(Z)}{1 - Z^{-1}} \quad (10)$$

be defined. When m assumes an odd number, for all the values of k, it is possible to determine $\hat{H}(k, j, Z)$ such that $$G(k, j, 1) = 0 \quad (j = 0, 1) \quad (11)$$

stands but when m assumes an even number, for k being an odd number, $\hat{H}(k, j, Z)$ cannot exist which satisfies equation (11). Practically, the case where m assumes an even number is more important but, in this case, it is impossible to determine $\hat{H}(k, j, Z)$ such that for all values of k ($0 < k < m$), equation (11) stands. Accordingly, with the code conversion based on equation (2), the signal to inband quantization noise power ratio has difficulties with exceeding that obtainable with BRM.

The code converting method according to the invention is advantageous in that for m being an even number, $\hat{H}(k, j, Z)$ is determined such that $$\hat{G}(2k, j, 1) = 0 \quad (12)$$

$$\hat{G}(2k'+1, 0, 1) = -\hat{G}(2k''+1, 1, 1) \quad (13)$$

stand.

By determining $\hat{H}(k, j, Z)$ in a manner as above, the quantization noise $$\hat{N}(Z) = \hat{Y}(z) - \tilde{X}(Z) \quad (14)$$

results in its integration $$\frac{N(Z)}{1 - Z^{-1}} = \sum_{i=o}^{\infty} \hat{G}(x_i, q_i, Z) Z^{-mi} \quad (15)$$

whose power spectrum becomes nearly zero around the direct current.

Equations (12) and (13) have the following physical meaning. Let integer Bi be defined in relation to the righthand term of equation (15) as follows:

$$Bi = \sum_{r=o}^{i} \hat{G}(x_r, q_r, 1) \quad (16)$$

When letting the value of the righthand term of equation (13) be a, Bi assumes a value of a for the initial odd-number sampled value, remains unchanged for even-number sampled values, and assumes a value of −a for the subsequent odd-number sampled value, returning to zero as a result of addition of −a to a. Subsequently, Bi similarly assumes the binary values a and 0(zero) so that the dc component of energy of $N(Z)/(1 - Z^{-1})$ becomes finite, thereby nullifying the dc component of the power spectrum.

As described above, it is possible to obtain the high signal to inband quantization noise power ratio by determining $\hat{H}(k, j, Z)$ such that $\hat{G}(k, j, 1)$ satisfies equations (12) and (13).

For m being an even number, $\hat{H}(k, j, Z)$ may be determined in the following manner. For k being an even number, $\hat{H}(k, j, Z)$ is determined such that $$\hat{H}(k,j,Z) = Z^{-m} \cdot \hat{H}(k,j,\frac{1}{Z}) \quad (19)$$

$$\hat{H}(k,j,1) = k \quad (20)$$

stand. Although not always being required to stand in this case, $$\hat{H}(k,0,Z) = \hat{H}(k,1,Z)$$

is advantageous to simplify the circuit. For k being an odd number, $\hat{H}(k,j,Z)$ is determined such that $$\hat{H}(k,0,Z) = P(k,Z) + Z^{-r} \quad (21)$$

$$\hat{H}(k,1,Z) = P(k,Z) + Z^{-m+r+1} \quad (22)$$

stand, where P(k,Z) represents a polynomial of the order related to $Z^{-1}$ not greater than (m−1) which has non-zero terms having each a coefficient of 1(one) and satisfies $P(k,Z) = Z^{-m} \cdot P(k,1/Z)$ and $P(k, 1) = k−1$, and $Z^{-r}$ represents the zero term in P(k,Z). Equations (21) and (22) may of course be expressed as, $$H(k,0,Z) = Z^{-m} \hat{H}(k,1,Z) \quad (23)$$

$$H(k,j,1) = k \quad (24).$$

As has been described, in the code converting method in which the input sampled value restricted to correspond to non-negative integer not greater than m (even number) sampled at the sampling period mT is subjected to the density conversion to be converted into the train of binary signals sampled at the sampling period T, the invention provides two types of coding mode as indicated by equations (21) and (22), and equations (23) and (24), respectively, for the input sampled value being an odd number and uses these coding modes alternately to nullify the integrating value of error due to quantization (quantization noise). This of course on the premise of the fact that the code conversion based on equations (19) and (20) is effected for the input sampled value being an even number.

The invention will now be described in more detail by way of embodiments.

Taking m=4, for instance, one embodiment of a code converting method according to the invention will first be described. For m being 4, $\hat{H}(x_i,j,Z)$ which satisfies equations (12) and (13) and, for k being an even number, $\hat{H}(k,0,Z) = \hat{H}(k,1,Z)$ is exemplified as below:

$$\hat{H}(0,j,Z) = 0$$

$$\hat{H}(1,0,Z) = Z^{-1}$$

$$\hat{H}(1,1,Z) = Z^{-2}$$

$$\hat{H}(2,j,Z) = 1 + Z^{-3}$$

$$\hat{H}(3,0,Z) = 1 + Z^{-1} + Z^{-3}$$

$$\hat{H}(3,1,Z) = 1 + Z^{-2} + Z^{-3}$$

$$\hat{H}(4,j,Z) = 1 + Z^{-1} + Z^{-2} + Z^{-3}$$

Figure 1:
FIG. 1 is a waveform diagram to explain one embodiment of code converting method according to the invention.
Figure 1:
Figure 1:
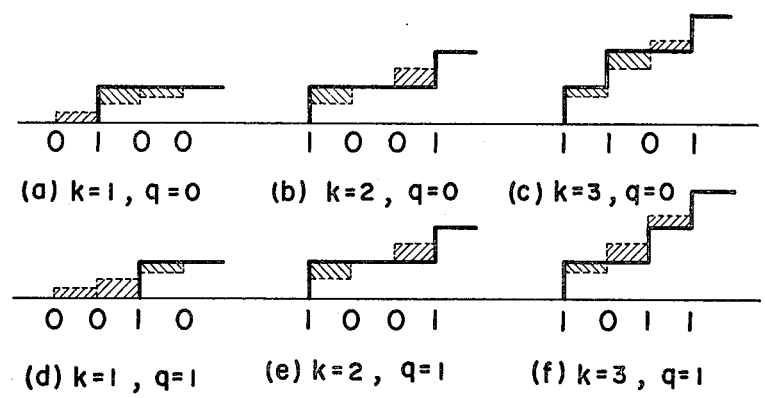

Values of equation (10) in accordance with $\hat{H}(x_i,j,Z)$ are diagrammatically shown in FIG. 1, in which values for k=1 and k=4 are omitted.

As will be seen from FIG. 1, when minus and plus portions of the hatched area illustrative of the integrating values of quantization noise are summed within each sampled value, equaling zero for k=2 but not equaling zero for k=1 and k=3. This value, unequal to zero, is a as aforementioned. According to this invention, however, when the initial odd sampled value is 1(one) and FIG. 1 (d) is selected, selection of FIG. 1 (d) for a subsequent odd sampled value of 1 or of FIG. 1 (f) for a subsequent odd sampled value of 3 follows to thereby nullifying the integrating value of quantization noise. When the initial odd sampled value is 3 and FIG. 1 (c) is selected, selection of FIG. 1(b) for a subsequent odd sampled value of 1 or of FIG. 1(f) for a subsequent odd sampled value of 3 follows, thereby also nullify the integrating value of quantization noise. This embodiment was for m=4. Practically, the code converting method for $m=2^n$ (n:integer) is important and a code converting circuit therefor embodying the invention will be described hereunder. Of course, a code converting circuit for general applications may easily be constructed in accordance with the usual digital signal processing circuit design in consideration of the embodiment of the invention to be described later in so far as $\hat{H}(k,j,Z)$ is determined. Additionally, in general, $\hat{H}(0,j,Z) = 0$ and $$\hat{H}(m,j,Z) = \sum_{i=0}^{m-1} Z^{-i}$$

must be held and therefore, function forms of $\hat{H}(k,j,Z)$ only for k being 0<k<m will be described.

Figure 2:
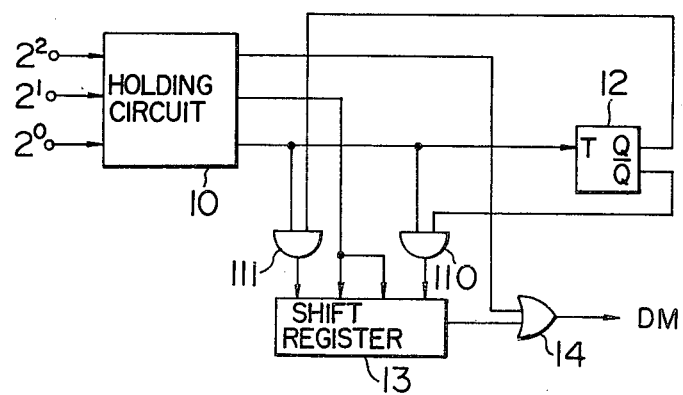
FIG. 2 is a schematic circuit diagram of one embodiment of a code converting circuit according to the invention.

FIG. 2 shows one embodiment of a code converting circuit according to the invention. In this embodiment, a code converting circuit is constructed when $$\hat{H}(1,0,Z) = 1$$

$$\hat{H}(1,1,Z) = Z^{-3}$$

$$\hat{H}(2,j,Z) = Z^{-1} + Z^{-2}$$

$$\hat{H}(3,j,Z) = \hat{H}(2,j,Z) + \hat{H}(1,j,Z)$$

are prescribed for m=4 and is different from the previous embodiment. As diagrammatically shown in FIG. 2, the code converting circuit comprises a holding circuit 10, AND gates 110, 111, a trigger flip-flop 12 (a flip-flop whose state is inverted by receiving "1" and operates in the same manner as a JK flip-flop does when J=K), a parallel-series shift register 13, and an OR gate 14. The clock period is 4T for the holding circuit 10 and trigger flip-flop 12 and is T for the shift register 13.

The least significant bit of sampled value $x_i$ of the input signal is coupled to the shift register 13 through AND gate 110 or 111 and the subsequent bit is coupled directly to the shift register 13. The most significant bit and the output of the shift register 13 are ORed at the OR gate 14 and for the most significant bit of "1", the output constantly assumes "1". Since the trigger flip-flop 12 inverts its output each time it receives an odd number sampled value, the circuit of FIG. 2 proves to be for realizing the aforementioned $\hat{H}(k,j,Z)$.

Figure 3:
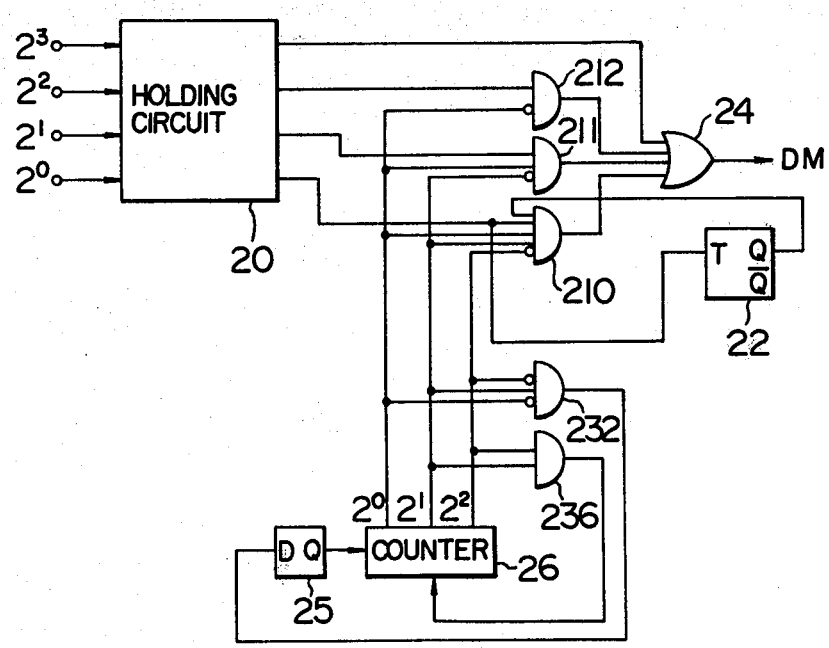
FIG. 3 is a schematic circuit diagram of another embodiment of a code converting circuit according to the invention.

FIG. 3 shows another embodiment of a code converting circuit for m=8 according to the invention. In this embodiment, $\hat{H}(k,j,Z)$ is representative of:

$$\hat{H}(1,0,Z)=Z^{-3}$$

$$\hat{H}(1,1,Z)=Z^{-4}$$

$$\hat{H}(2,j,Z)=Z^{-1}+Z^{-6}$$

$$\hat{H}(3,j,Z)=\hat{H}(2,j,Z)+\hat{H}(1,j,Z)$$

$$\hat{H}(4,j,Z)=1+Z^{-2}+Z^{-5}+Z^{-7}$$

$$\hat{H}(5,j,Z)=\hat{H}(4,j,Z)+\hat{H}(1,j,Z)$$

$$\hat{H}(6,j,Z)=\hat{H}(4,j,Z)+\hat{H}(2,j,Z)$$

$$\hat{H}(7,j,Z)=\hat{H}(6,j,Z)+\hat{H}(1,j,Z).$$

The input signal $x_i$ corresponds to the output signal y(nT) in accordance with the following table.

Table 1

| $x_i$ | | y (nT) | | | | | | | |
|---|---|---|---|---|---|---|---|---|---|
| Decimal | Binary | 0 | T | 2T | 3T | 4T | 5T | 6T | 7T |
| 0 | 0 0 0 0 | 0 | 0 | 0 | 0 | 0 | 0 | 0 | 0 |
| 1 | 1 0 0 0 | 0 | 0 | 0 | 1 | 0 | 0 | 0 | 0 |
|   |         | 0 | 0 | 0 | 0 | 1 | 0 | 0 | 0 |
| 2 | 0 1 0 0 | 0 | 1 | 0 | 0 | 0 | 0 | 1 | 0 |
|   |         | 0 | 1 | 0 | 1 | 0 | 0 | 1 | 0 |
| 3 | 1 1 0 0 | 0 | 1 | 0 | 0 | 1 | 0 | 1 | 0 |
| 4 | 0 0 1 0 | 1 | 0 | 1 | 0 | 0 | 1 | 0 | 1 |
|   |         | 1 | 0 | 1 | 1 | 0 | 1 | 0 | 1 |
| 5 | 1 0 1 0 | 1 | 0 | 1 | 0 | 1 | 1 | 0 | 1 |
| 6 | 0 1 1 0 | 1 | 1 | 1 | 0 | 0 | 1 | 1 | 1 |
|   |         | 1 | 1 | 1 | 1 | 0 | 1 | 1 | 1 |
| 7 | 1 1 1 0 | 1 | 1 | 1 | 0 | 1 | 1 | 1 | 1 |
| 8 | 0 0 0 1 | 1 | 1 | 1 | 1 | 1 | 1 | 1 | 1 |

The code converting circuit as diagrammatically shown in FIG. 3 comprises a holding circuit 20, AND gates 210, 211, 212, 232 and 236, a trigger flip-flop 22, an OR gate 24, a delay flip-flop 25, and a counter 26. The clock period is 8T for the holding circuit 20 and trigger flip-flop 22 and is T for the delay flip-flop 25 and counter 26. In connection with the input/output of the holding circuit and the output of the counter, the k-th bit counted starting from the least significant bit is herein called the k-th bit.

The input sampled value is interpolated at the holding circuit 20 and its first bit is coupled to the OR gate 24 through the AND gate 210 at a time that the non-inverted first bit and second bit outputs of the counter 26 and an inverted third bit output thereof assume "1", and the AND gate 210 delivers its output "1" when the non-inverted output of trigger flip-flop 22 assumes "1".

The second bit of holding circuit 20 is coupled to the OR gate 24 through the AND gate 211 when the non-inverted first bit and inverted second bit outputs of the counter 26 assume "1". The third bit of holding circuit 20 is coupled to the OR gate 24 through the AND gate 212 in a similar manner, and the fourth bit is directly coupled to the OR gate 24.

The counter 26 makes increment when the output of delay flip-flop 25 is "1" and is reset when the output of AND gate 236 is "1". Accordingly, with the above arrangement, the output of the counter 26 sequentially assumes 0, 1, 2, 3, 3, 4, 5, 6 and 0. Namely, the output "2" of the counter 26 is detected by the AND gate 232 to inhibit the increment of counter 26 through the delay flip-flop 25. Also, the output "6" of counter 26 is detected by the AND gate 236 which, in turn, delivers the output for resetting the counter 26.

The above circuit arrangement proves to realize the aforementioned H(k, j, Z).

As having been described, the invention can make nearly zero around the direct current the upper spectrum of the quantization noise component even in the signal resulting from integrating the quantized binary signal so that a high signal to inband quantization noise power ratio may be obtained. Accordingly, the invention can provde a useful code converting method and system for practical purposes.

What we claim is:

1. A code converting system in which a multivalue signal $x_1$ ($x_1$ being non-negative integer not greater than m being even number) of a sampling period mT is received and subjected to density conversion to be delivered out in the form of a train of m binary signals of a sampling period T, the system comprising a holding circuit for holding said multivalue signal $x_1$ at the period mT, logic means connected to said holding circuit serving to invert the output state of said logic means when said multivalue signal assumes an odd number, and operation means receiving the output of the holding circuit and said output $q_i$ ($q_i$ being 1(one) or zero) of the inverting means and delivering out a Z-transform $\beta(Z)$ of the binary signals to be delivered out, said Z-transform being expressed as, $$Y(Z) = \sum_{i=0}^{\infty} \hat{H}(x_i, q_i, Z)Z^{-mi}$$

where $\hat{H}(x_i,q_i,Z)$ represents a polynomial of the order related to $Z^{-1}$ less than (m−1) which has non-zero terms having each a coefficient of 1(one) and which satisfies $\hat{H}(k,q_i,1)==k$, $\hat{H}(k,q_i,Z)=Z^{-(m-1)}\hat{H}(k,q_i,1/Z)$ for k being even number, and $\hat{H}(k,0,Z)=Z^{-(m-1)}\hat{H}(k,1,1/Z)$ for k being an odd number.

2. A code converting system according to claim 1, wherein the output $q_i$ satisfies $$q_o=0$$

$$q_{i+1}=q_i+x_{i+1}+m, \text{ mod } 2$$

3. A code converting system according to claim 2, wherein the $\hat{H}(x_i,q_i,Z)$ satisfies $$\hat{H}(k,0,Z)=\hat{H}(k,1,Z)$$

for k being an even number.

4. A code converting system according to claim 3, wherein m represents m=$2^n$ (n being an integer).

5. A code converting system in which a multivalue signal $x_i$ ($x_i$ being non-negative integer not greater than m being even number) of a sampling period mT is received and subjected to density conversion to be delivered out in the form of a train of m binary signals of a sampling period T, the system comprising:
   input terminals for receiving binary signals corresponding to said multivalue signal $x_i$;

a multi-bit holding circuit connected with said input terminals for holding said binary signals for a time period of mT;

a logic circuit connected so as to be fed with the least significant bit output of said holding circuit, said logic circuit serving to invert its output $q_i$ ($q_i$ being "1" or "0") when said least significant bit output of said holding circuit is "1"; and operation means receiving the output of said holding circuit and said output $q_i$ of said logic circuit and producing m binary signal trains, a Z-transform of said m binary signal trains being expressed as $$Y(Z) = \sum_{i=o}^{\infty} \hat{H}(x_i, q_i, Z)Z^{-mi}$$

where $\hat{H}(x_i,q_i,Z)$ represents a polynominal related to $Z^{-1}$ of the orders less than $(m-1)$ which has non-zero terms each having a coefficient of 1(one) and which satisfies $\hat{H}(k,q_i,1)=k$, $\hat{H}(k,q_i,Z)= Z^{-(m-1)}\hat{H}(k,q_i,1/Z)$ for k being even number, and $\hat{H}(k,0,Z)=Z^{-(m-1)}\hat{H}(k,1,1/Z)$ for k being an odd number.

6. A code converting system according to claim 5, in which said logic circuit has two output terminals for delivering mutually different outputs, and said operation means includes an m-bit shift register having parallel input terminals; an OR circuit and two AND circuits each having two input terminals, one of the output terminals of said logic circuit being connected with an input terminal of one of said AND circuits, the other output terminal of said logic circuit being connected with an input terminal of the other AND circuit, said least significant bit output of said holding circuit being fed to each of the other input terminals of said AND circuits, the most significant bit output of said holding circuit being fed to one input terminal of said OR circuit, the series output of said shift register being fed to the other input terminal of said OR circuit, and the outputs of said AND circuits and the other bit outputs of said holding circuit being fed to said parallel input terminals of said shift register.

7. A code converting system according to claim 5, in which said operation means includes a counter serving to count from 0 to $(m-2)$, to count $(m-2)/2$ twice and to produce parallel outputs, gate circuits the number of which is equal to the number of bits of said holding circuits minus 1 (one) and an OR circuit, each of said gate circuits being fed with different one of the bit outputs, except the most significant bit output, of said holding circuit, the output of said logic circuit and the parallel outputs of said counter being fed to said gate circuits in a manner that said bit outputs of said holding circuits are gated thereby, and the most significant bit output of said holding circuit and the outputs of said gate circuits being fed to said OR circuit.

* * * * *